United States Patent [19]

Ardini et al.

[11] Patent Number: 4,876,501
[45] Date of Patent: Oct. 24, 1989

[54] METHOD AND APPARATUS FOR HIGH ACCURACY MEASURMENT OF VLSI COMPONENTS

[75] Inventors: Joseph L. Ardini, Needham; Brian Lefsky, West Newton; Barbara J. Farr, Newton, all of Mass.

[73] Assignee: Prime Computer, Inc., Natick, Mass.

[21] Appl. No.: 285,362

[22] Filed: Dec. 14, 1988

Related U.S. Application Data

[63] Continuation of Ser. No. 37,708, Apr. 13, 1987, abandoned.

[51] Int. Cl.$^4$ ............................................. G01R 31/00
[52] U.S. Cl. .............................. 324/73 R; 324/57 DE; 324/73 AT; 371/62
[58] Field of Search ............. 324/57 DE, 73 R, 77 H, 324/73 AT; 371/15, 25, 61, 62; 307/602, 608; 328/55, 56, 72, 73; 377/76

[56] References Cited

U.S. PATENT DOCUMENTS

| | | | |
|---|---|---|---|
| 3,784,907 | 1/1974 | Eichelberger | 324/73 AT |
| 4,063,080 | 12/1977 | Eichelberger et al. | 371/62 |
| 4,244,048 | 1/1981 | Tsui | 324/73 R |
| 4,330,750 | 5/1982 | Mayor | 328/55 |
| 4,377,757 | 3/1983 | Könemann et al. | 324/73 R |
| 4,519,078 | 5/1985 | Komonytsky | 324/73 R |
| 4,597,042 | 6/1986 | d'Angeac et al. | 324/73 R |
| 4,602,210 | 7/1986 | Fasang et al. | 324/73 R |
| 4,602,349 | 7/1986 | Blackley et al. | 371/25 |
| 4,613,970 | 9/1986 | Masuda et al. | 324/73 R |
| 4,698,588 | 10/1987 | Hwang et al. | 324/73 R |
| 4,712,061 | 12/1987 | Lach | 324/57 DE |

FOREIGN PATENT DOCUMENTS 0139854  8/1982  Japan .................................... 371/61

Primary Examiner—Reinhard J. Eisenzopf
Assistant Examiner—W. Burns
Attorney, Agent, or Firm—Wolf, Greenfield & Sacks

[57] ABSTRACT

Methods and apparatus for accurately measuring propagation delay through very high speed VLSI devices with a test instrument having errors comparable to the delays being measured. The VLSI device has a plurality of parallel operational signal paths, each with a very short propagation delay. The VLSI device is fabricated with control circuitry for selectively connecting the parallel operational signal paths in series in a test mode so as to define a test signal path comprising multiple operational signal paths. The test signal path has a relatively long propagation delay which can be measured with acceptable accuracy by the test instrument. The test signal path is defined so that it bypasses clocked circuit elements on the VLSI device. Since the operational signal paths are on the same integrated circuit and have very well correlated operating characteristics, the propagation delay through the test signal path is a good representation of the integrated circuit dynamic operation. When the integrated circuit is not in the test mode, the series connections are disabled and the parallel circuits operate in their normally intended manner. A minimum of circuitry is added to the VLSI device in order to implement the test mode.

12 Claims, 3 Drawing Sheets

METHOD AND APPARATUS FOR HIGH ACCURACY MEASURMENT OF VLSI COMPONENTS

This application is a continuation of application Ser. No. 07/037,708, filed Apr. 13, 1987 now abandoned.

FIELD OF THE INVENTION

This invention relates to dynamic testing of high speed VLSI devices and, more particularly, to a method and apparatus for providing high accuracy propagation delay measurements in VLSI devices.

BACKGROUND OF THE INVENTION

One of the critical performance parameters of a very large scale integrated (VLSI) circuit is the propagation delay through the device. VLSI devices include hundreds or thousands of transistors and are conventionally used in high speed digital computer systems. Variations in propagation delay through signal paths of the device affect the overall operating speed of the computer. Unusually long propagation delays are indicative of a malfunction in the VLSI device. Accordingly, it is a common practice to measure propagation delays through selected signal paths of VLSI devices before they are incorporated into a computer or other digital system.

As used herein, propagation delay refers to the time required for an input signal to propagate from the input of the prescribed circuit path to the output of that circuit path. The propagation delay is measured by measuring the time difference between the input and output signals.

A well-known principle of test measurement is that the measurement error should be much less than the expected value of the parameter being measured. For example, in measuring a 100 nanosecond propagation delay, a tester error of ±1 nanosecond is sufficient to obtain ±1% measurement accuracy. However, when testing state-of-the-art high speed digital circuits, it is not feasible to follow this principle since tester errors are often comparable to the parameter being measured. A test instrument having an accuracy of ±1 nanosecond provides a meaningless measurement when the propagation delay being measured is one or a few nanoseconds since the measured value can be in error by up to 100%. Test instruments with the required level of accuracy are not available at present. Clearly, another approach to measuring short propagation delays is necessary.

In the past, the above-noted problem has been overcome by adding circuits in order to increase the measured propagation delay. For example, gates may be added outside the functional circuit path to increase the measured propagation delay from 1 to 10 nanoseconds. However, such added gates are nonfunctional and add substantially to the total chip area. Furthermore, added gate circuitry may not be in the same area of the chip and may be constructed of different materials, thereby introducing uncertainties into the measured propagation delay.

Another problem in the measurement of propagation delay through digital circuits is that the circuits frequently contain clocked- circuit elements between input and output pins. When this occurs, it is impossible to measure propagation delay.

It is a general object of the present invention to provide improved methods and apparatus for measuring the dynamic characteristics of VLSI devices.

It is a further object of the present invention to provide methods and apparatus for measuring the propagation delay of VLSI devices without adding substantial circuitry to the VLSI device.

It is yet another object of the present invention to provide methods and apparatus for accurately measuring the propagation delay through very high speed digital VLSI devices.

It is still another object of the present invention to provide methods and apparatus for measuring the propagation delay of VLSI devices including one or more clocked circuit elements in operational circuit paths between input and output pins.

SUMMARY OF THE INVENTION

According to the present invention, these and other objects and advantages are achieved in a digital integrated circuit having an operational mode and a test mode. The integrated circuit comprises a plurality of digital circuits each having an operational signal path therethrough from an input to an output and control means responsive to a test mode signal for coupling selected ones of the digital circuits in series to define a test signal path comprising at least two operational signal paths connected in series so that a test signal applied to the integrated circuit in the test mode propagates through the test signal path. By coupling digital circuits with relatively short operational signal paths in series, there is provided a relatively long test signal path so that propagation delay can accurately be measured without substantial addition of circuitry to the integrated circuit. When the operational signal path contains clocked circuit elements, the test signal path bypasses such clocked circuit elements.

The control means preferably includes a gating means for coupling digital circuits in series. The gating means can include logic gates each having one input coupled to the test mode signal, another input coupled to the output of the previous digital circuit in the test signal path and an output coupled to the input of the next digital circuit in the test signal path. A logic element associated with the input to each digital circuit can be provided with an additional input for connecting the test signal path from the previous digital circuit. The preferred embodiment requires only one additional logic gate per digital circuit coupled in series in the test mode.

Since the digital circuits which are connected in series to define the test signal path are located on a single integrated circuit and are comprised primarily of actual operational signal paths, the digital circuits in the test signal path have very well correlated operating characteristics and the total propagation delay through the test signal path is a good representation of the dynamic characteristics of the integrated circuit.

More than one test signal path can be defined on an integrated circuit. Digital circuits can be grouped according to similar device characteristics or similar propagation delays. The enabling of the test signal path can be controlled commonly or independently.

According to another aspect of the present invention, there is provided a method for measuring propagation delay through a digital integrated circuit including a plurality of digital circuits, each having an operational signal path therethrough. The method comprises the steps of coupling selected ones of the digital circuits in series to define a test signal path through the selected digital circuits, the test signal path having an input node and an output node, applying a test signal to the input node of the test signal path, and measuring the propagation delay between the test signal applied to the input node and an output signal which propagates through the test signal path and appears at the output node.

BRIEF DESCRIPTION OF THE DRAWINGS

For a better understanding of the present invention together with other and further objects, advantages and capabilities thereof, reference is made to the accompanying drawings which are incorporated herein by reference and in which.

DETAILED DESCRIPTION OF THE INVENTION

The present invention provides methods and apparatus for accurately measuring propagation delay through very high speed VLSI devices. The technique of the invention utilizes the fact that the VLSI devices normally have a number of parallel operational signal paths either between input and output pins or between internal circuit elements. Each of the parallel signal paths has a very short propagation delay which is difficult to measure accurately. In accordance with the invention, the parallel operational signal paths are connected in series in a test mode so as to define a test signal path comprising multiple operational signal paths. The test signal path is defined so as to bypass clocked circuit elements. The test signal path is established in the test mode by control circuitry fabricated as a part of the integrated circuit. The test signal path has a relatively long propagation delay which can be measured with acceptable accuracy. Since all of the operational signal paths are on the same integrated circuit and should have very well correlated operating characteristics, the propagation delay through the test signal path is a good representation of the integrated circuit dynamic operation. When the integrated circuit is not in the test mode, the series connections are disabled and the parallel circuits operate independently in their normally intended manner.

Figure 1:
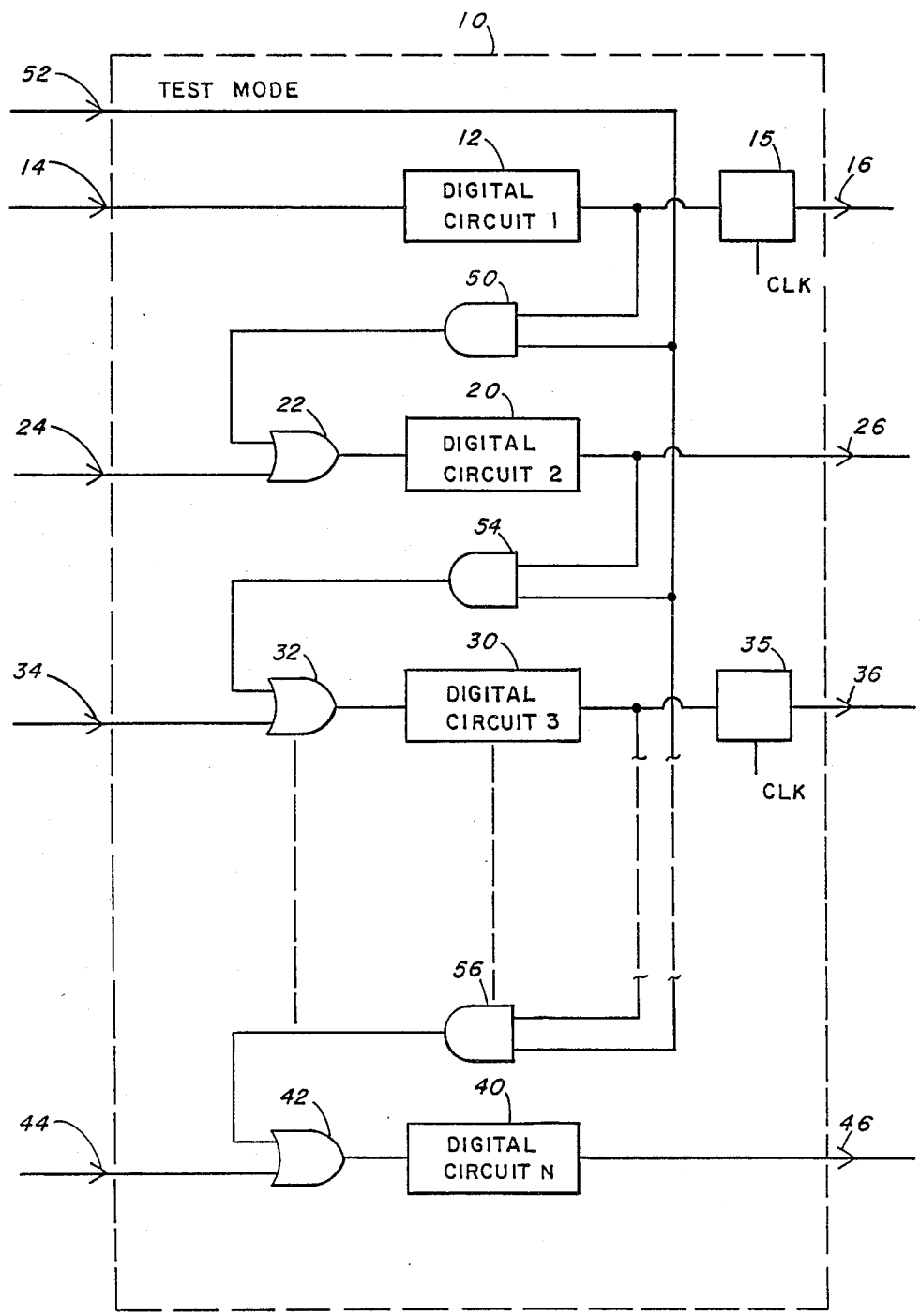
FIG. 1 is a schematic diagram of an integrated circuit in accordance with the present invention.

An integrated circuit 10 in accordance with the present invention is illustrated in schematic form in FIG. 1. The integrated circuit 10 includes a first digital circuit 12 having an input coupled to an input pin 14 and an output coupled through a clocked circuit element 15 to an output pin 16. A second digital circuit 20 has an input coupled through an OR gate 22 to an input pin 24 and an output coupled to an output pin 26. A third digital circuit 30 has an input coupled through an OR gate 32 to an input pin 34 and an output coupled through a clocked circuit element 35 to an output pin 36. The integrated circuit 10 may include any number of such digital circuits. In FIG. 1 there is illustrated an Nth digital circuit 40 having an input coupled through an OR gate 42 to an input pin 44 and an output coupled to an output pin 46. Each of the digital circuits 12, 20, 30, 40 includes circuitry for performing a prescribed function. The digital circuits may contain the same or different circuitry and may contain circuitry of any complexity. It is required that the digital circuits 12, 20, 30, 40 include combinatorial logic and/or latching circuitry rather than circuitry requiring clock signals for operation. The clocked circuit elements 15, 35 may contain clocked flip-flops, synchronous counters or the like. The digital circuits each may include multiple inputs and multiple outputs, some of which may be connected to I/0 pins on the integrated circuit and others of which may be connected internally.

Each of the digital circuits 12, 20, 30, 40 has an associated operational signal path therethrough. During normal operation of the integrated circuit 10, digital circuit 12 has an operational signal path from input pin 14 to output pin 16, digital circuit 20 has an operational signal path from input pin 24 through OR gate 22 and digital circuit 20 to output pin 26; digital circuit 30 has an operational signal path from input pin 34 through OR gate 32 and digital circuit 30 to output pin 36; and digital circuit 40 has an operational signal path from input pin 44 through OR gate 42 and digital circuit 40 to output pin 46. As noted above, these operational signal paths have propagation delays which are too short to be measured accurately. In addition, the operational signal paths from input pin 14 to output pin 16 and from input pin 34 to output pin 36 have clocked circuit elements 15 and 35, respectively, which prevent a simple measurement of propagation delay. Clocked circuit elements 15, 35 are shown by way of example and may or may not be present at various points in the VLSI device depending on the circuit design being implemented.

In accordance with the invention, there is provided control means for selectively connecting the operational signal paths in the integrated circuit 10 in series so as to define a test signal path. Referring again to FIG. 1, an AND gate 50 has one input connected to the output of digital circuit 12 and another input connected to an input pin 52. The output of AND gate 50 is connected to an input of OR gate 22. The other input of OR gate 22 is connected to input pin 24, and the output of OR gate 22 is connected to the input of digital circuit 20. An AND gate 54 has one input connected to the output of digital circuit 20 and another input connected to input pin 52. The output of AND gate 54 is connected to an input of OR gate 32. The other input of OR gate 32 is connected to input pin 34, and the output of OR gate 32 is connected to the input of digital circuit 30. The same configuration of AND gate and OR gate are connected between each of the digital circuits selected for inclusion in the test signal path. An AND gate 56 has one input connected to the output of the previous digital circuit in the test signal path and the other input connected to input pin 52. The output of AND gate 6 is connected to an input of OR gate 42. The other input of OR gate 42 is connected to input pin 4, and the output of OR gate 42 is connected to the input of digital circuit 40. The integrated circuit 10 illustrated in FIG. 1 has an operational mode and a test mode. The mode of operation is controlled by a TEST MODE signal applied to input pin 52. In the operational mode, the TEST MODE signal is maintained in an inactive state, and gates 50, 54, 56 are inhibited. As a result, the series connections between digital circuits 12, 20, 30, 40 are open and the digital circuits operate in parallel in the manner for which they were intended.

n the test mode, the TEST MODE signal is switched to an active state, and AND gates 50, 54, 6 are enabled. As a result, a connection is established between the output of digital circuit 12 and the input of digital circuit 20 through AND gate 0 and OR gate 22. Similarly, a connection is established between the output of digital circuit 20 and the input of digital circuit 30 through AND gate 4 and OR gate 32. A connection is established between the previous digital circuit and digital circuit 40 through AND gate 56 and OR gate 42. Thus, in the test mode, there is established a test signal path between input pin 14 and output pin 46 through each of the digital circuits 12, 20, 30, 40. The test signal path has a relatively long propagation delay which can be accurately measured. It is noted that the test signal path is defined so as to bypass the clocked circuit elements 15, 35.

Figure 2:
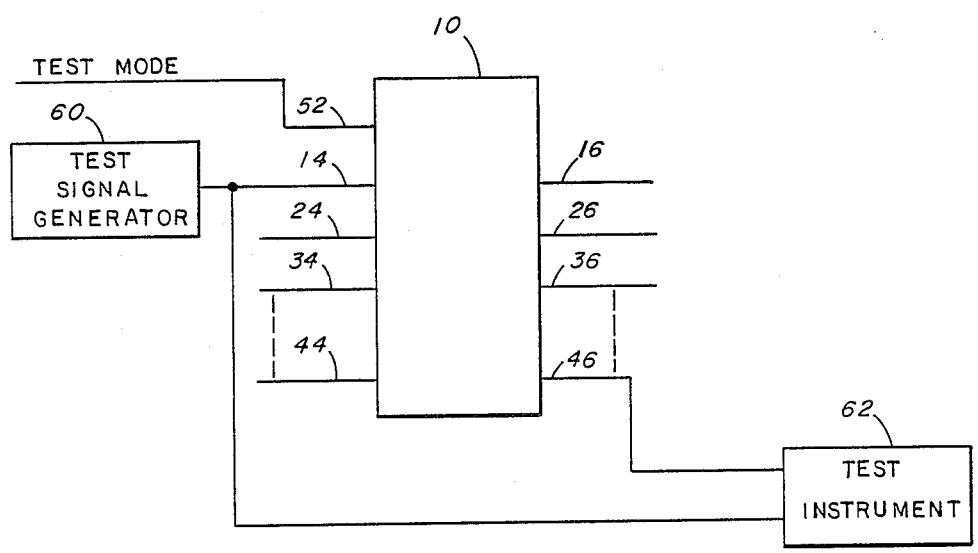
FIG. 2 is a schematic diagram illustrating the measurement of propagation delay in accordance with the present invention.

The measurement technique of the present invention is illustrated with reference to FIG. 2. Normal supply voltages (not shown) are connected to integrated circuit 10 and the TEST MODE signal applied to input pin 52 is placed in the active state so that the test signal path between input pin 14 and output pin 46 is enabled. A test signal generator 60 has its output connected to input pin 14 of integrated circuit 10 and to an input of a test instrument 62. Output pin 46 of integrated circuit 10 is connected to another input of the test instrument 62. The propagation delay is typically measured with a high speed digital VLSI tester such as a Fairchild Sentry 21. The test signal generator 60 provides a fast rise time pulse which propagates through the test signal path in integrated circuit 10 as described hereinabove and appears as an output signal on output pin 46. The test instrument 62 is thus provided at its two inputs with the input test signal and the delayed test signal. The time delay between the two signals is the propagation delay through the test signal path of the integrated circuit 10.

By way of example, assume that the propagation delay between input pin 14 and output pin 16 is nominally 2 nanoseconds and that the test instrument 62 has a measurement accuracy of ±1 nanosecond. A measurement of the propagation delay between input pin 14 and output pin 16 will have an error of ±50%. Now, assume that the test signal path through the integrated circuit 10 passes through ten digital circuits, each having a nominal 2 nanosecond propagation delay. The total propagation delay from input pin 14 to output pin 46 will therefore be 20 nanoseconds, and the measurement can be made with a ±5% accuracy. Clearly, the accuracy of the measurement depends on the accuracy of the test instrument 62 and on the total delay through the test signal path.

The chain or series connection of parallel operational signal paths to define a relatively long test signal path is useful in the case of an integrated circuit device because each of the operational signal paths is assumed to have similar characteristics. This assumption is accurate since the integrated circuit device is extremely small and the same set of processing steps and processing materials have been utilized on the entire device. Thus, variations in the processing steps or materials will affect all devices on the integrated circuit in a similar fashion. The measurement of propagation delay through the test signal path is compared with an expected, or nominal, range of values in order to determine whether the particular integrated circuit meets its specifications.

It will be understood that the configuration of the test signal path is subject to numerous variations within the scope of the present invention. For example, the OR gates 22, 32, 42 may be added to the integrated circuit 10 in order to implement the test mode control function. Alternatively, the OR gates 22, 32, 42 may be implemented by adding an input to an existing gate contained within the respective digital circuits 20, 30, 40. In addition, the inputs and outputs of intermediate digital circuits, such as digital circuits 20 and 30, are not necessarily connected to input pins or output pins of the integrated circuit 10. These inputs and outputs may be internally connected to other digital circuits in accordance with the prescribed logic design. All that is necessary to establish a test signal path is to provide an input pin for supplying the test signal to the input of the test signal path and an output pin for measuring the output of the test signal path. Furthermore, AND gates 50, 54, 56 can be replaced with any suitable element for selectively connecting the digital circuits in series in a test mode.

Figure 3:
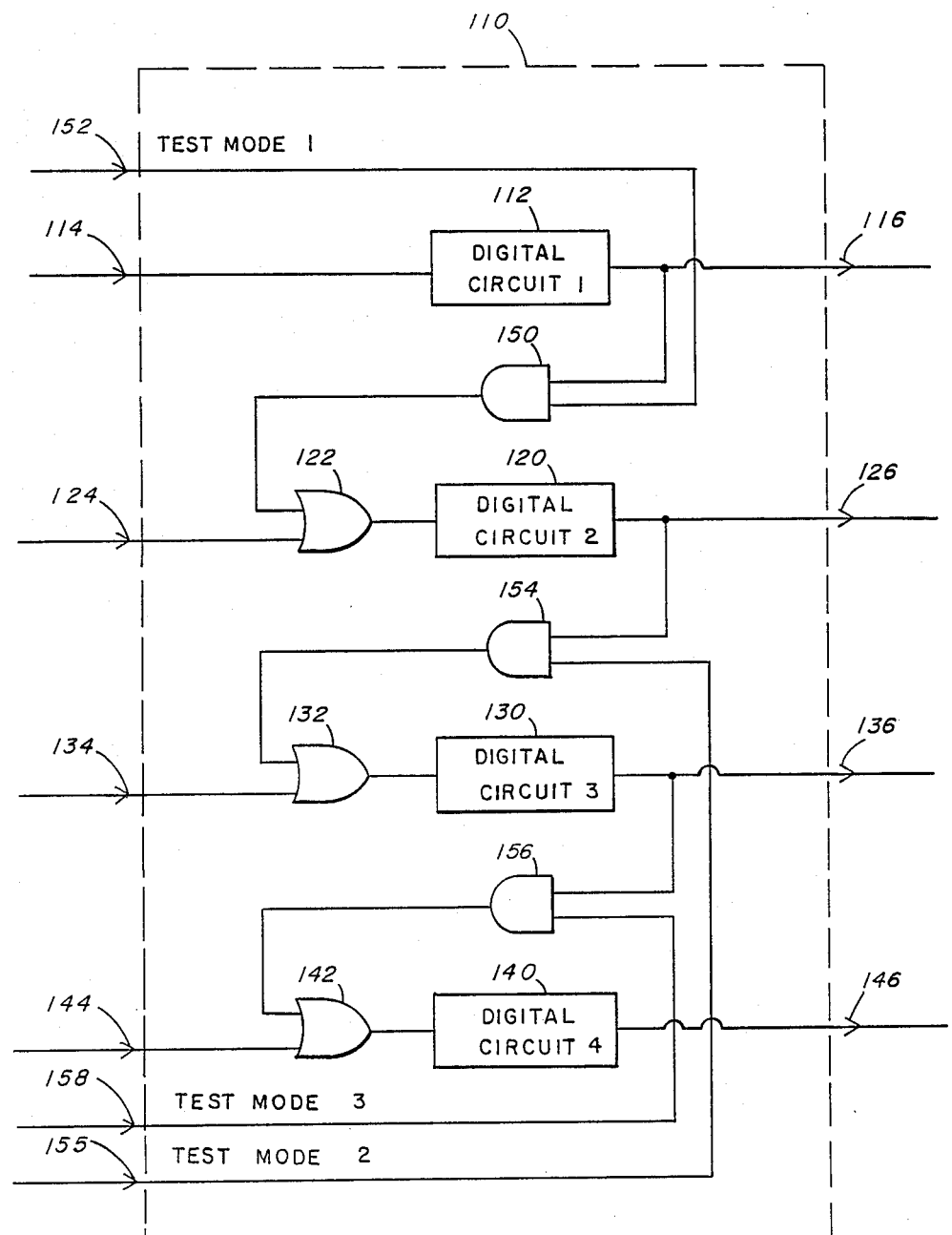
FIG. 3 is a schematic diagram of an integrated circuit in accordance with an alternate embodiment of the present invention.

It will further be understood that all digital circuits on the integrated circuit are not necessarily included in the test signal path. Two or more independently or commonly controlled test signal paths may be defined on a single integrated circuit. An example of such a configuration is shown in FIG. 3. An integrated circuit 110 includes a first digital circuit 112 having an input connected to an input pin 114 and an output connected to an output pin 116. A second digital circuit 120 includes an input connected through an OR gate 122 to an input pin 124 and an output connected to an output pin 126. A third digital circuit 130 has an input coupled through an OR gate 132 to an input pin 134 and an output coupled to an output pin 136. A fourth digital circuit 140 has an input coupled through an OR gate 142 to an input pin 144 and an output coupled to an output pin 146.

In this embodiment, the control means includes individually controlled AND gate elements to provide flexibility in establishing test signal paths. An AND gate 150 has one input connected to the output of digital circuit 112 and another input connected to an input pin 152. The output of AND gate 150 is connected through OR gate 122 to the input of digital circuit 120. An AND gate 154 has one input connected to the output of digital circuit 120 and another input connected to an input pin 155. The output of AND gate 154 is connected through OR gate 132 to the input of digital circuit 130. An AND gate 156 has one input connected to the output of digital circuit 130 and another input connected to an input pin 158. The output of AND gate 156 is coupled through OR gate 142 to the input of digital circuit 140. TEST MODE 1, TEST MODE 2 and TEST MODE 3 signals are supplied on input pins 152, 155 and 158, respectively, to control the test signal paths in the test mode.

By various combinations of TEST MODE signals on input pins 152, 155 and 158, various test signal paths can be defined through the integrated circuit 110. For example, when TEST MODE 1 signal on input pin 152 is active, AND gate 150 is enabled and a test signal path is defined between input pin 114 and output pin 126. Similarly, when TEST MODE 3 signal on input pin 158 is active, AND gate 156 is enabled and a test signal path is defined between input pin 134 and output pin 146. When the TEST MODE signals on input pins 152, 155 and 158 are all active, AND gates 150, 154 and 156 are all enabled and a test signal path is defined between input pin 114 and output pin 146. These different test signal paths may be useful in testing different parts of the integrated circuit 110 with increased accuracy. A drawback to this arrangement is that additional input pins are required to establish the different test modes. The number of test mode input pins can be reduced by on-chip encoding of the test mode signals utilizing a binary code. While some of the test signal paths defined in FIG. 3 have only two digital circuits connected in series, it will be understood that each different test signal path can contain any prescribed number of digital circuits connected in series in the test mode.

In a further embodiment of the invention, multiple test signal paths on an integrated circuit can be controlled by a single TEST MODE signal. It may be desirable to group digital circuits having propagation delays in the same ranges in separate test signal paths. For example, several digital circuits having propagation delays in the range up 5 nanoseconds may be connected to define a first test signal path, while another group of digital circuits having propagation delays in the range of 5-15 nanoseconds may be grouped together to define a second test signal path. Alternatively, digital circuits may be grouped by function or by proximity on the chip. As noted above, the test signal paths can be altered by use of more than one control signal to test different portions of the integrated circuit in a predetermined manner.

While there has been shown and described what is at present considered the preferred embodiments of the present invention, it will be obvious to those skilled in the art that various changes and modifications may be made therein without departing from the scope of the invention as defined by the appended claims.

What is claimed is:

1. A digital integrated circuit having an operational mode and a test mode, comprising:
    a plurality of digital circuits selected from combinatorial logic, latching circuitry and combinations thereof, each digital circuit having an operational signal path therethrough from an input to an output;
    control means for permitting measurement of propagation delay through said plurality of digital circuits with test equipment having an operational speed that is comparable to the operating speed of said plurality of digital circuits;
    said control means comprising intercoupling gate means and means connecting the gate means between separate digital circuits, said gate means being responsive to a test mode signal for individually coupling the outputs of selected ones of said plurality of digital circuits to the inputs of other selected ones of said plurality of digital circuits in series to define a test signal path comprising at least two operational signal paths connected in series so that a test signal applied to said integrated circuit in the test mode propagates through said test signal path;
    whereby the propagation delay through said test signal path is the sum of the individual propagation delays through each of the digital circuits in the test signal path, and is substantially longer than the propagation delay through any of said operation signal paths and can be accurately and directly measured with said test equipment without further processing.

2. A digital integrated circuit as defined in claim 1 wherein said gate means includes a logic gate having one input coupled to said test mode signal, another input coupled to the output of the previous digital circuit in said test signal path and an output coupled to the input of the next digital circuit in said test signal path.

3. A digital integrated circuit as defined in claim 1 wherein said digital circuits each include an input logic gate having an input for connection of the output from the previous digital circuit in said test signal path.

4. A method for measuring propagation delay through a digital integrated circuit including a plurality of digital circuits each having an operational signal path therethrough, with test equipment having an operating speed that is comparable to the operating speed of said plurality of digital circuits, said method comprising the steps of:
    individually coupling the outputs of selected ones of said plurality of digital circuits to the inputs of other selected ones of said plurality of digital circuits in series to define a test signal path on said integrated circuit through said selected digital circuits, said test signal path having an input node and an output node;
    applying a test signal to the input node of said test signal path; and
    measuring the propagation delay between the test signal applied to the input node and an output signal which propagates through said test signal path and appears at the output node, whereby the propagation delay through said test signal path is the sum of the individual propagation delays through each of the digital circuits in the test signal path, and is substantially longer than the propagation delay through any of said digital circuits and can be accurately and directly measured by said test equipment without further processing.

5. A delay measuring method as defined in claim 4 wherein the step of individually coupling the outputs of selected ones of said digital circuits to the inputs of other selected ones of said digital circuits in series includes the step of individually coupling digital circuits with similar delay characteristics in series.

6. A delay measuring method as defined in claim 4 wherein the step of individually coupling the outputs of selected ones of said digital circuits to the inputs of other selected ones of said digital circuits in series includes the step of individually coupling digital circuits with similar delay characteristics in series to define at least two test signal paths through said integrated circuit.

7. A delay measuring method as defined in claim 4 wherein the step of individually coupling the outputs of selected ones of said digital circuits to the inputs of other selected ones of said digital circuits in series includes selectively and individually coupling the outputs of different ones of said digital circuits to the inputs of other different ones of said digital circuits in series to define different test signal paths.

8. A delay measuring method as defined in claim 4 wherein the step of individually coupling the outputs of selected ones of said digital circuits to the inputs of other selected ones of said digital circuits in series is performed under control of a test mode signal when measurement of propagation delay is required.

9. A digital integrated circuit having an operation mode and a test mode comprising:

a first plurality of digital circuits, each having an operational signal path therethrough from an input to an output;

a second plurality of digital circuits, each having an operational signal path therethrough from an input to an output, said digital circuits each being selected from combinational logic, latching circuitry and combinations thereof;

a first control means for permitting measurement of propagation delay through said first plurality of digital circuits with test equipment having an operating speed that is comparable to the operating speed of said digital circuits, said first control means comprising intercoupling gate means and means connecting the gate means between separate digital circuits, said gate means being responsive to a first test mode signal for individually coupling the outputs of selected ones of said first plurality of digital circuits to the inputs of other selected ones of said first plurality of digital circuits in series to define a first test signal path comprising at least two operational signal paths connected in series so that a first test signal applied to the input of said first test signal path in the test mode propagates through said first test signal path;

a second control means for permitting measurement of propagation delay through said second plurality of digital circuits with said test equipment, said second control means comprising intercoupling means responsive to a second test mode signal for individually coupling the outputs of selected ones of said second plurality of digital circuits to the inputs of other selected ones of said second plurality of digital circuits in series to define a second test signal path comprising at least two operational signal paths connected in series so that a second test signal applied to the input of said second test signal path in the test mode propagates through said second test signal path, whereby the propagation delays through said first and second test signal paths are the sum of the individual propagation delays through each of the digital circuits in the test signal path, respectively, and are substantially longer than the propagation delay through any of said operational signal paths and can be accurately and directly measured with said test equipment without further processing.

10. A digital integrated circuit as defined in claim 9 wherein said first test mode signal is commonly connected to said first control means and to said second control means so that said first test signal path and said second test signal path are commonly controlled.

11. A digital integrated circuit as defined in claim 1 including at least one clocked circuit element, said test signal path being defined to bypass said clocked circuit element.

12. A digital integrated circuit as defined in claim 9 including at least one clocked circuit element in each of the said first and second digital circuits, said test signal path being defined to bypass said clocked circuit elements.

* * * * *